United States Patent
Lin et al.

(10) Patent No.: US 12,191,147 B2
(45) Date of Patent: Jan. 7, 2025

(54) COATING COMPOSITION FOR PHOTOLITHOGRAPHY

(71) Applicant: Taiwan Semiconductor Manufacturing Company, Ltd., Hsinchu (TW)

(72) Inventors: Ya-Ting Lin, Hshinchu (TW); Yen-Ting Chen, Taipei (TW); Wei-Han Lai, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 137 days.

(21) Appl. No.: 17/443,574

(22) Filed: Jul. 27, 2021

(65) Prior Publication Data
US 2022/0406593 A1  Dec. 22, 2022

Related U.S. Application Data

(60) Provisional application No. 63/193,774, filed on May 27, 2021.

(51) Int. Cl.
| | | |
|---|---|---|
| *H01L 21/027* | (2006.01) | |
| *C08L 25/08* | (2006.01) | |
| *G03F 7/09* | (2006.01) | |
| *G03F 7/34* | (2006.01) | |

(52) U.S. Cl.
CPC .......... *H01L 21/0276* (2013.01); *C08L 25/08* (2013.01); *G03F 7/091* (2013.01); *G03F 7/34* (2013.01)

(58) Field of Classification Search
CPC ............ H01L 21/0276; H01L 21/0271; H01L 21/32139; H01L 21/0272; C09D 125/18; G03F 7/34; G03F 7/091; C08L 25/08
See application file for complete search history.

(56) References Cited

U.S. PATENT DOCUMENTS

| | | | | |
|---|---|---|---|---|
| 5,994,430 A | * | 11/1999 | Ding | ..................... C09B 69/106 430/326 |
| 2001/0049075 A1 | * | 12/2001 | Kishimura | .............. G03F 7/039 430/950 |
| 2008/0096125 A1 | * | 4/2008 | Kim | ......................... G03F 7/091 430/270.1 |
| 2009/0087776 A1 | * | 4/2009 | Hirano | .................. G03F 7/0397 430/326 |
| 2009/0139868 A1 | * | 6/2009 | Shrader | ................... H01L 24/02 205/118 |
| 2014/0004712 A1 | * | 1/2014 | Chen | ........................ G03F 7/11 252/589 |

* cited by examiner

*Primary Examiner* — Sean M DeGuire
*Assistant Examiner* — Andrew Preston Traywick
(74) *Attorney, Agent, or Firm* — Lippes Mathias LLP

(57) ABSTRACT

Methods for making a semiconductor device using an improved BARC (bottom anti-reflective coating) are provided herein. The improved BARC comprises a polymer formed from at least a styrene monomer having at least one or two hydrophilic substituents. The monomer(s) and substituents can be varied as desired to obtain a balance between film adhesion and wet etch resistance. Also provided is a semiconductor device produced using such methods.

20 Claims, 5 Drawing Sheets

COATING COMPOSITION FOR PHOTOLITHOGRAPHY

PRIORITY CLAIM AND CROSS-REFERENCE

This application claims priority to U.S. Provisional Patent Application Ser. No. 63/193,774, filed on May 27, 2021, which is incorporated by reference in its entirety.

BACKGROUND

Photoresist is a light-sensitive material used in photolithography for transferring a pattern on a substrate. A layer of photoresist is deposited, and then exposed to a pattern of light. Depending on the type of photoresist, exposure to light degrades or strengthens the exposed photoresist. The weak parts of the exposed photoresist are then removed using developer, leaving the desired pattern behind.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A shows a substrate with a metal layer, a BARC layer, and a patterned photoresist layer. FIG. 5B shows the pattern transferred to the BARC layer.

FIG. 5C shows the pattern transferred to the metal layer. FIG. 5D shows the final substrate with a patterned metal layer.

FIG. 6A shows a substrate with a BARC layer and a patterned photoresist layer. FIG. 6B shows the pattern transferred to the BARC layer.

FIG. 6C illustrates one method. Shown is the substrate after metal is applied to the patterned BARC layer, filling in the exposed areas. FIG. 6D shows the final substrate with a patterned metal layer. FIG. 6E illustrates another method. Shown is the substrate after ions are implanted through the exposed areas of the patterned BARC layer. FIG. 6F shows the final substrate with an implanted pattern.

DETAILED DESCRIPTION

Figure 1A:
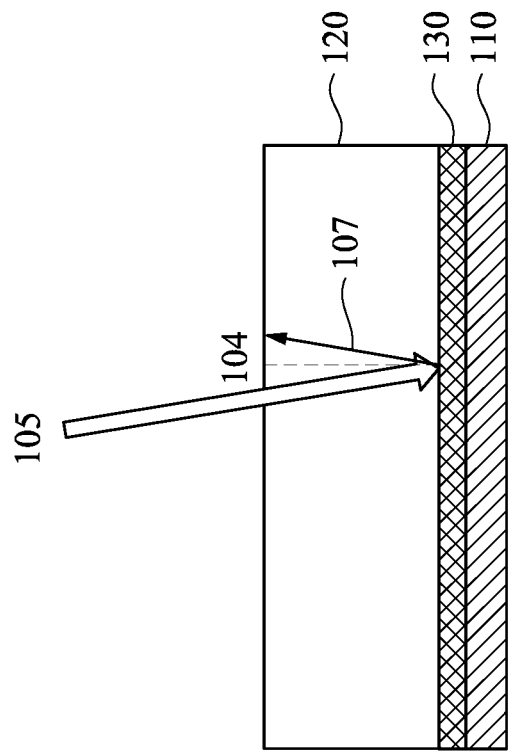
FIG. 1A is an illustration showing how a reflective substrate can cause development of photoresist in undesired locations.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "upon" or "on", when used in reference to a second layer being upon or on a first layer, are intended to refer to the first layer as being the bottom or support for all of the layers and components which are on or upon the first layer. In other words, unless dictated by the context, these terms should not be construed as requiring the second layer to directly contact the first layer. These terms should be construed as permitting other layers to be between the first layer and the second layer.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The present disclosure may refer to temperatures for certain method steps. It is noted that these references are to the temperature at which the heat source is set, and do not specifically refer to the temperature which must be attained by a particular material being exposed to the heat.

Figure 1B:
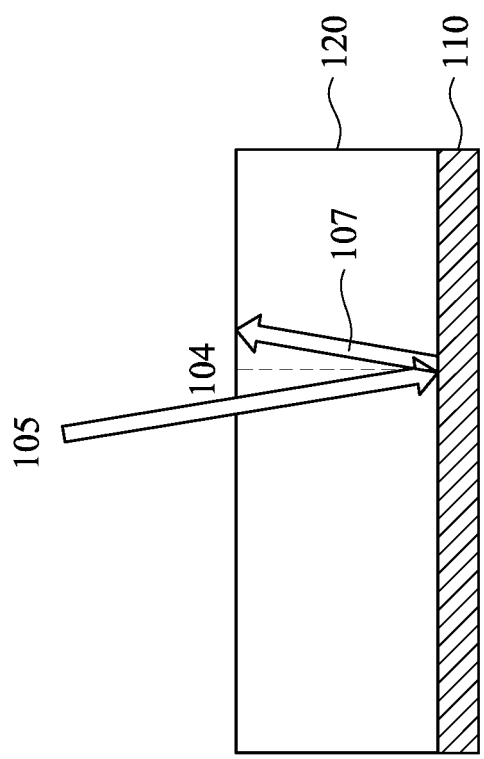
FIG. 1B is an illustration showing how the use of a bottom anti-reflective coating (BARC) reduces or prevents the development of photoresist in undesired locations.

The present disclosure relates to bottom anti-reflective coatings (BARCs) and their applications. In one application, as noted, photoresist is reactive to light exposure. When the photoresist layer is applied to a reflective substrate, light reflection from the substrate/resist interface can create variations in light exposure, that cause problems with critical dimension (CD) control. For example, light can reflect into areas where exposure was not intended, changing the desired pattern. BARCs can be applied between the substrate and the photoresist layer to minimize or eliminate such problems. This is illustrated in FIG. 1A and FIG. 1B. In FIG. 1A, a photoresist layer 120 is applied over a silicon substrate 110, and then exposed to light 105. Light reflecting from the substrate/resist interface and back towards the surface changes the development rate of the photoresist, and can also cause development in undesired locations. The dotted line 104 indicates the boundary for desired photoresist development, while the reflected arrow 107 indicates where reflected light can cause undesired development of photoresist. In FIG. 1B, the addition of a BARC layer 130 between the photoresist layer 120 and the substrate 110 reduces reflection (as indicated by thinner arrow), so that the desired development is attained.

Figure 2:
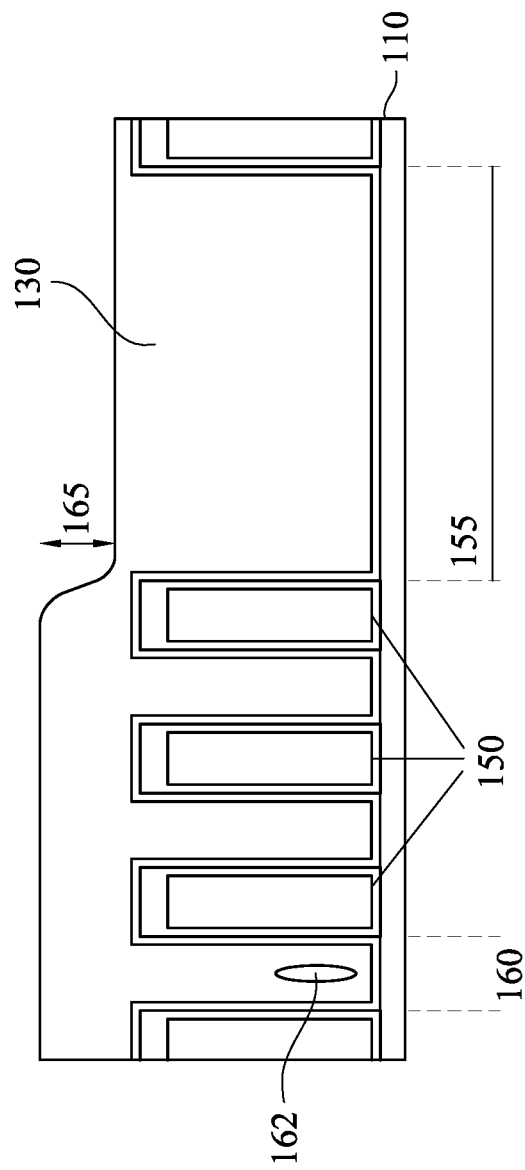
FIG. 2 is a cross-sectional schematic of a wafer substrate, in accordance with some embodiments, illustrating how a BARC can be used to fill gaps.

In a second application, multi-patterning processes are used to build three-dimensional structures such as a multi-patterned gate (MPG) for use with a fin field-effect transistor (FinFET). BARCs can be used to fill gaps present between three-dimensional structures so that further processing can occur without affecting the three-dimensional structures. The gap fill ability measures the smallest gap size that the BARC can fill; a lower value is preferred. This is illustrated in FIG. 2, which is a cross-sectional schematic of a wafer substrate 110. The left side shows a set of metal fins 150 spaced closely together (i.e. a "dense zone"), along with an isolation zone 155 separating the set of metal fins from an adjacent set. The gap 160 between the closely-spaced fins is smaller than the isolation zone. A BARC 130 is used to fill these gaps, as well as the isolation zone. The BARC is somewhat viscous, and so BARC material can flow from the dense zone into the isolation zone, as indicated by the difference in height (reference numeral 165). If the gap fill ability of the BARC is insufficient and does not completely fill the gaps, an empty seam 162 can result, which is illustrated here. Keeping in mind that the overall structure is three-dimensional, the empty seam may result in reduced protective ability of the BARC such that the three-dimensional metal structure(s) might be damaged during subsequent etching processes.

Figure 3:
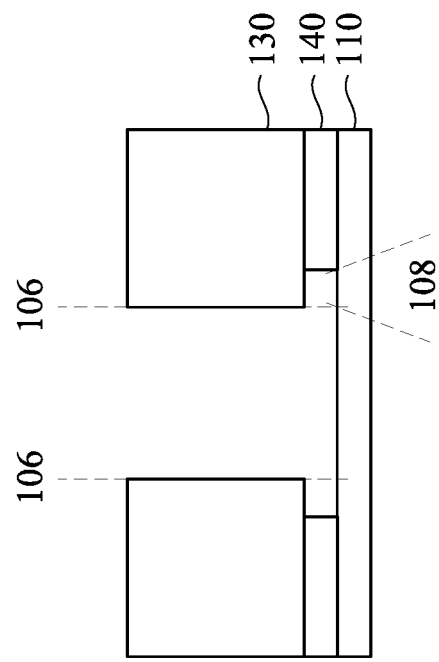
FIG. 3 is a cross-sectional schematic of a wafer substrate, in accordance with some embodiments, illustrating how a BARC can be used as a protective layer during wet etching processes.

In a third application, BARCs can be applied to a metal layer to protect the metal layer during etching processes. For example, wet etching processes use strong oxidants, such as ozone ($O_3$) or hydrogen peroxide ($H_2O_2$) or ammonium hydroxide ($NH_4OH$), or acids/bases in high concentrations to remove various metals and to remove defects between layers. However, lateral etching can occur during wet etching. At the beginning of the wet etch process, the etchant removes metal vertically. Over time, non-removed metal is also exposed on its side, and further etching can also occur laterally (i.e. parallel to the substrate). This lateral etching can remove metal under the BARC which was not intended to be removed (undercutting). For these applications, a BARC should have high wet etch resistance, or in other words will not be removed upon exposure to such oxidants or acids/bases. In addition, a BARC desirably has high film adhesion to the metal layer upon which the BARC is applied. Such adhesion can reduce or prevent lateral etching by wet chemicals during metal removal processes. This is illustrated in FIG. 3. As seen here, a metal layer 140 is present on a silicon substrate 110, and a BARC layer 130 upon the metal layer has been patterned. The metal layer is then wet etched. The dotted lines 106 illustrate the desired final metal layer structure, which shows how undercutting can occur due to lateral etching. The lateral difference between the two lines (reference numeral 108) is also referred to as the metal boundary effect, or the bias due to lateral etching. A lower metal boundary effect is more desired for equal processing conditions.

The present disclosure thus relates to bottom anti-reflective coatings (BARCs) which have a combination of good gap fill ability, high wet etch resistance, and high film adhesion. Such BARCs can be used in various lithography systems including deep ultraviolet (DUV) systems and extreme ultraviolet (EUV) lithography systems. For reference, the EUV lithography process employs light having a wavelength for example from 124 nm to 10 nm, including about 13.5 nm. The BARCs of the present disclosure, compositions for forming such BARCs, and methods for using such BARCs are contemplated and described herein.

The BARCs of the present disclosure are formed from a coating composition that includes a polymer. In some embodiments, the polymer includes a repeating unit of Formula (I):

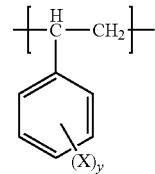

Formula (I)

where X is a hydrophilic substituent; and
where y is 2 to 5.

As is evident, the repeating unit of Formula (I) is derived from a styrene monomer having at least two hydrophilic substituents. The 1-position is the carbon atom of the phenyl ring that joins the ethylene portion of the styrene monomer. Non-limiting examples of hydrophilic substituents include —OH, —$NH_2$, —NHR, —$NR_2$, —SH, —(C=O)H, —(C=O)R, —COOH, —COOR, —CO—$NR_2$, —O(C=O)R, —NR—(C=O)R, —$SO_3$, —$SO_4$, and —$PO_4$, wherein R is independently hydrogen, alkyl, alkenyl, alkynyl, or aryl. Salts and protected substituents thereof are also contemplated as falling within the scope of the present disclosure. Each hydrophilic substituent is independently selected.

The term "alkyl" refers to a radical composed entirely of carbon atoms and hydrogen atoms which is fully saturated. The alkyl radical may be linear, branched, or cyclic. The alkyl radical has the ability to form a single bond to one or two different non-hydrogen atoms, depending on the context. For example, the formulas —$CH_2$—$CH_3$ and —$CH_2$—$CH_2$— should both be considered alkyl. As used herein, an alkyl group has from 1 to about 6 carbon atoms.

The term "alkenyl" refers to a radical composed entirely of carbon atoms and hydrogen atoms which contains at least one carbon-carbon double bond that is not part of an aryl structure. The alkenyl radical may be linear, branched, or cyclic. The alkenyl radical may be bonded to one or two different non-hydrogen atoms, depending on the context.

The term "alkynyl" refers to a radical composed entirely of carbon atoms and hydrogen atoms which contains at least one carbon-carbon triple bond. The alkynyl radical may be bonded to one or two different non-hydrogen atoms, depending on the context.

The term "aryl" refers to an aromatic radical composed entirely of carbon atoms, and optionally hydrogen atoms along the perimeter of the radical. The aryl radical has the ability to form a single bond to one or two different non-hydrogen atoms, depending on the context. For example, the radicals —$C_6H_5$ and —$C_6H_4$— could both be referred to as phenyl and should both be considered aryl radicals. As used herein, an aryl group has from 6 to about 18 carbon atoms. The term "aryl" should not be construed as including substituted aromatic radicals, such as methylphenyl group (7 carbon atoms).

The —OH substituent may also be referred to as a hydroxyl group.

The —NH$_2$, —NHR, and —NR$_2$ substituents can also be referred to as amino groups.

The —(C=O)H and —(C=O)R substituents can be referred to collectively as aldehyde groups.

The —COOH and —COOR substituents can be referred to collectively as carboxy groups.

The —O(C=O)R substituent can also be referred to as an ester group. The —CO—NR$_2$ and —NR—(C=O)R substituents can be referred to collectively as amide groups, although they bond to the phenyl ring through different atoms.

It is noted that in some embodiments, these substituents may be protected. Generally, a protecting group is a reversibly formed derivative of the substituent. The protecting group is temporarily attached to decrease reactivity, so that the protected substituent does not react under synthetic conditions to which the molecule is subjected in one or more subsequent steps. For example, protecting groups for amino substituents can include carbamates, acetamides, benzylamine, triphenylamine, or p-toluenesulfonamide. Such protected substituents are also contemplated as falling within the scope of the present disclosure.

In particular embodiments, y=2. The two substituents can be in any location on the phenyl ring, for example in the 3,4-; 2,4-; or 3,5-positions. In some specific embodiments of Formula (I) where y=2, the two substituents are —OH. In other specific embodiments, one substituent is —OH and one substituent is —NR$_2$, wherein R is independently alkyl or hydrogen.

In particular embodiments, y=3. Due to steric effects, desirably the three substituents are not located on three adjacent carbon atoms of the phenyl ring. Non-limiting examples of positions include the 2,4,5-; 2,4,6-; 2,3,5-; and 2,3,6-positions. In some specific embodiments of Formula (I) where y=3, the three substituents are —OH. In other specific embodiments, the three substituents are independently selected from —OH and —NR$_2$, wherein R is independently alkyl or hydrogen.

The polymer of Formula (I) can be a homopolymer or a copolymer. In some specific embodiments, the polymer is a homopolymer, and y=2 or 3. In further embodiments, the polymer is a homopolymer, and y=2 or 3, and the substituents are independently selected from —OH and —NR$_2$, wherein R is independently alkyl or hydrogen.

In particular embodiments, when the polymer is a copolymer, the polymer may include one or two additional repeating units or comonomers. It is contemplated that the copolymer is more desirably a block copolymer than a random copolymer. Generally, the copolymer is not a graft copolymer. For example, the copolymer may have the structure of Formula (II) or Formula (III):

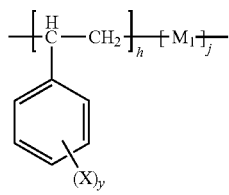

Formula (II)

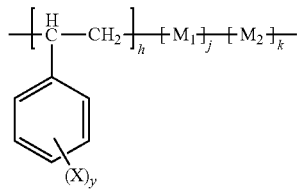

Formula (III)

wherein X and y are as defined in Formula (I);
$M_1$ and $M_2$ are independently co-monomers that are different from each other;
h, j, and k are the mole percentage of the respective monomer, and are greater than zero;
wherein h and j together add up to 100 mole percent in Formula (II); and
wherein h, j, and k together add up to 100 mole percent in Formula (III).

In particular embodiments, the comonomer(s) $M_1$, $M_2$ are independently a $C_2$-$C_8$ olefin, a substituted $C_2$-$C_8$ olefin, an acrylate, a diene, an acrylamide, acrylonitrile, acrylophenone, a different styrene monomer, or maleic acid.

The $C_2$-$C_8$ olefin contains a single carbon-carbon double bond which becomes part of the copolymer backbone. It is noted that these olefinic comonomers are hydrophobic, and may also be used to control the hydrophilicity/hydrophobicity of the overall polymer.

The term "substituted" refers to at least one hydrogen atom on a carbon atom being substituted with another functional group. In particular embodiments, each hydrogen atom is substituted with a halogen, hydroxyl, cyano, amino, nitro, or a linkage to an aryl group. For example, one substituted $C_2$-$C_8$ olefin is tetrafluoroethylene (—CF$_2$—CF$_2$—), where four hydrogen atoms are substituted with fluorine. Another example is vinyl chloride (—CH$_2$—CHCl—), where one hydrogen atom is substituted with chlorine. A third example is vinyl alcohol (—CH$_2$—CHOH—), where one hydrogen atom is substituted with a hydroxyl group.

In particular, it is contemplated that the comonomer may contain a chromophore group that can absorb radiation, thus preventing reflection of the radiation. Such chromophore groups may include aromatic (i.e. aryl) groups like phenyl, naphthyl, anthracenyl, phenanthracenyl, quinolinyl, etc, which may be present on a substituted $C_2$-$C_8$ olefin through a linkage such as a carboxylic ester linkage. It is noted these aromatic groups are hydrophobic, and thus may also affect the hydrophilicity/hydrophobicity of the overall polymer.

The term "acrylate" refers to a monomer containing a vinyl group and an carboxylate group, having the general formula of CR$_2$=CR(COOR), where each R is independently hydrogen or alkyl. For purposes of monomers $M_1$ and $M_2$, the acrylate is monofunctional.

The term "diene" refers to a radical composed entirely of carbon atoms and hydrogen atoms, and having two carbon-carbon double bonds. The double bonds are usually present at each end of the radical.

The term "acrylamide" refers to a monomer having the general formula of CR$_2$=CR(CO)NR$_2$, where each R is independently hydrogen or alkyl.

The term "acrylonitrile" refers to a monomer having the general formula of CR$_2$=CR(CN), where each R is independently hydrogen or alkyl.

The term "acrylophenone" refers to a monomer having the general formula of $CR_2=CR(CO-C_6H_5)$, where each R is independently hydrogen or alkyl.

The term "maleic acid" refers to a monomer having the general formula of $ROOC-CR=CR-(COOR$, where each R is independently hydrogen or alkyl.

In particular embodiments of Formula (II), the mole values h and j are each from about 10 mole percent (mole %) to about 90 mole %, or from about 20 mole % to about 80 mole %, or from about 30 mole % to about 70 mole %, or from about 40 mole % to about 60 mole %. These values may vary depending on the desired structure of the BARC polymer. In some embodiments, the styrene monomer having at least two hydrophilic substituents is a majority of the copolymer.

With respect to Formula (III), the mole values h, j, and k may each range from about 10 mole % to about 90 mole %, or from about 20 mole % to about 80 mole %, or from about 30 mole % to about 70 mole %, or from about 40 mole % to about 60 mole % (adding up to 100 mole %). In particular embodiments of Formula (III), the mole value h can be from about 35 to about 60 mole percent. In other words, in some embodiments the styrene monomer having at least two hydrophilic substituents is a majority of the copolymer. In embodiments, the mole values j and k are each from about 20 to about 40 mole percent.

In some other embodiments of Formula (II) and Formula (III), the comonomers $M_1$ and $M_2$ (as appropriate) are also a styrene monomer which differs from the styrene monomer that forms the repeating unit of Formula (I). They may differ in the location of the hydrophilic substituents, the number of hydrophilic substituents, and/or the identity of the hydrophilic substituents. However, the comonomer does not need to be hydrophilic, and can also be hydrophobic.

In some additional embodiments, the polymer includes a repeating unit of Formula (IV):

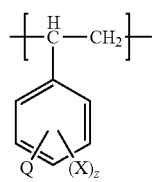

Formula (IV)

where Q is a hydrophilic substituent selected from the group consisting of $-NH_2$, $-NHR$, $-NR_2$, $-SH$, $-(C=O)H$, $-(C=O)R$, $-COOH$, $-COOR$, $-CO-NR_2$, $-O(C=O)R$, $-NR-(CEO)R$, $-SO_3$, $-SO_4$, and $-PO_4$, wherein R is independently alkyl or hydrogen;

where X is a hydrophilic substituent; and where z is 0 to 4.

The repeating unit of Formula (IV) differs from that of Formula (I) in that only one hydrophilic substituent is required. However, that single substituent cannot be a hydroxyl group. Polyhydroxystyrene (PHS) is commonly used in conventional BARCs. Otherwise, there is significant overlap between the polymers of Formula (I) and Formula (IV). It is noted that the substituents Q and X (when present) may be in any location on the phenyl ring.

With respect to the repeating unit of Formula (IV), again, non-limiting examples of hydrophilic substituents for X include $-OH$, $-NH_2$, $-NHR$, $-NR_2$, $-SH$, $-(C=O)H$, $-(C=O)R$, $-COOH$, $-COOR$, $-CO-NR_2$, $-O(C=O)R$, $-NR-(C=O)R$, $-SO_3$, $-SO_4$, and $-PO_4$, wherein R is independently alkyl or hydrogen. Salts and protected substituents thereof for both X and Q are also contemplated as falling within the scope of the present disclosure. Each hydrophilic substituent is independently selected.

The polymer of Formula (IV) can also be a copolymer. For example, the copolymer may have the structure of Formula (V) or Formula (VI):

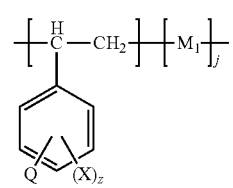

Formula (V)

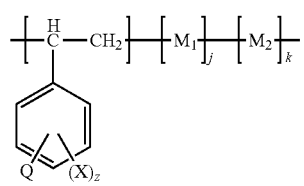

Formula (VI)

wherein Q, X, and z are as defined in Formula (IV);

$M_1$ and $M_2$ are independently co-monomers that are different from each other;

h, j, and k are the mole percentage of the respective monomer, and are greater than zero;

wherein h and j together add up to 100 mole percent in Formula (V); and wherein h, j, and k together add up to 100 mole percent in Formula (VI).

The discussion of the polymers of Formulas (I)-(III) also apply to the polymers of Formulas (IV)-(VI).

The polymer may have a weight average molecular weight (Mw) of about 1,000 to about 100,000, or from about 1,000 to about 10,000, depending on the desired combination of viscosity and gap-fill ability. However, in some particular embodiments, the polymer may have a weight average molecular weight (Mw) of about 4,000 to about 5,000. It is believed that polymers with a molecular weight within this range have a good combination of gap fill ability and wet etch resistance. If the molecular weight is too high, the gap fill ability of the polymer may become insufficient. If the molecular weight is too low, the wet etch resistance of the polymer may become insufficient. It is also believed that as the percentage of hydrophilic groups of the polymer increases, that the molecular weight can decrease and still obtain a desired balance between gap fill ability and wet etch resistance. The weight average molecular weight of the polymer is measured prior to crosslinking.

Desirably, the backbone of the polymer contains only carbon-carbon bonds, as bonds containing oxygen or nitrogen may be more easily cleaved by oxidants during wet etching processes. Thus, comonomers which may create such bonds generally are not used. For example, bisphenol-A, which is used in the production of polycarbonate, is generally not used as a comonomer in the polymer of the BARC.

The polymers for use in the BARC compositions of the present disclosure can be made using conventional polymerization processes and purification processes. The desired monomers are typically polymerized via addition polymerization, using catalysts. The polymers may be atactic or syndiotactic, as desired, which may depend on the presence and/or identity of any comonomer(s).

The coating composition also includes a crosslinker. When the coating composition is baked, the crosslinker crosslinks with the polymer. Examples of suitable crosslinkers include those containing having a melamine, benzoguanamine, glycoluril, or urea core with 2 to 6 reactive substituents such as a methylol group, an alkoxymethyl group and an acyloxymethyl group. Other crosslinkers may contain multiple functional groups such as, for example, epoxide groups or ester groups.

The polymer may be present in the BARC composition in amounts of about 10 wt % to about 90 wt %, based on the total weight of the BARC composition. The crosslinker may be present in the BARC composition in amounts of about 10 wt % to about 90 wt %, based on the total weight of the BARC composition. The weight ratio of polymer to crosslinker in the BARC composition may range from about 10:90 to about 90:10.

The BARC composition may also include acid generators, such as thermal acid generators of photo acid generators. The present disclosure is not limited to the use of any specific acid generator or combination of acid generators. The acid generated therefrom aids in removing protecting groups (if present) and in crosslinking of the BARC composition. If present, the BARC composition may contain from about 0.01 wt % to about 1 wt % of an acid generator.

Examples of photo acid generators include onium salts such as iodonium salts or sulfonium salts; hexafluoroarsenates; triflates; perfluoroalkane sulfonates; substituted aryl sulfonates; sulfonate esters of hydroxyimides; diazo compounds such as α,α'bis-sulfonyl diazomethanes; naphthoquinone-4-diazides; alkyl disulfones; succinimide derivatives; and nitrobenzyl compounds. Desirably, the photo acid generator is activated by exposure to suitable wavelengths and is not significantly activated by thermal treatment.

Examples of thermal acid generators may include sulfonate salts, including fluorinated sulfonate salts; and various ammonium salts. Desirably, the thermal acid generator generates acid upon thermal treatment of relatively low temperatures for relatively low exposure times. For example, acid may be generated at temperatures of about 250° C. or lower, at exposure times of about 30 seconds to about 120 seconds. Desirably, the thermal acid generator is activated by exposure to thermal treatment and is not significantly activated by exposure to light.

The BARC composition may also include separate dyes or chromophores that absorb radiation, thus preventing reflection of the radiation. The dyes generally include aromatic groups like phenyl, naphthyl, anthracenyl, phenanthracenyl, quinolinyl, etc. The dyes can also include a crosslinking group to participate in the crosslinking reaction with the polymer and the crosslinker. If present, the BARC composition may contain from about 0.01 wt % to about 10 wt % of the dye.

The BARC composition may also include a solvent in which the polymer and crosslinker and other optional components are suspended or dissolved, for ease of application upon the desired substrate. It is contemplated that when baked, the resulting BARC becomes substantially insoluble in the solvent. In addition, the solvent desirably has a boiling point below the baking temperature. Non-limiting examples of suitable solvents may include propylene glycol methyl ether (PGME); gamma-butyrolactone (GBL); anisol; propylene carbonate; sulfolane; dimethyl succinate; dimethyl adipate; ethyl lactate; and other alcohol based solvents, and combinations and mixtures thereof. The BARC composition may contain from about 20 wt % to about 80 wt % of the solvent, based on the total weight of the BARC composition.

In use, the substrate can be coated with the BARC composition using conventional means, such as spin-coating at high speeds to obtain a coating or film with uniform thickness and free of defects (such as bubbles). The coating or film is then baked or cured to induce crosslinking and solvent removal, and hardening of the BARC. In some particular embodiments, the baking occurs at a temperature of about 125° C. to about 275° C. In particular embodiments, the baking takes place for a time of about 30 seconds to about 250 seconds. The baking can be performed using a hot plate or similar equipment.

The effectiveness of BARCs is usually compared to a control coating composition in which the polymer used is polyhydroxystyrene (PHS). The presence of additional hydrophilic substituents in the BARC polymer increases adhesion between the BARC and the metal film/layer to which the BARC is applied, compared to PHS. Without being limited by theory, it is believed that the hydrophilic substituents form hydrogen bonds with the metal film/layer. In particular embodiments, the metal film/layer is a metal oxide, metal, or metal nitride. For example, the metal film/layer may be an aluminum oxide ($Al_xO_y$), or titanium nitride (TiN), or titanium oxide ($TiO_x$). The increased adhesion also increases the wet etch resistance of the metal film/layer itself. In addition, the hydrophilic substituents aid in filling narrow gaps between metal structures, again due to the formation of hydrogen bonds with the metal structure.

The BARC layer should not peel away from the metal layer. In use, the effectiveness of the BARC layer can be shown using two measures. First, during wet etching, the BARC layer does not retreat from its applied location. Second, during wet etching, the bias due to lateral etching (i.e. metal boundary effect) is desirably low, or in other words undercutting does not occur.

The BARC can be used in desired processing steps in applications such as those for making a flat film, a FinFET, or a nano-sheet. It is noted that wet etching processes for metal removal may use both an oxidant, a base, and/or an acid (depending on the metal), and they may be used in any order. Regardless of the order, the BARC can effectively resist their effect.

Figure 4:
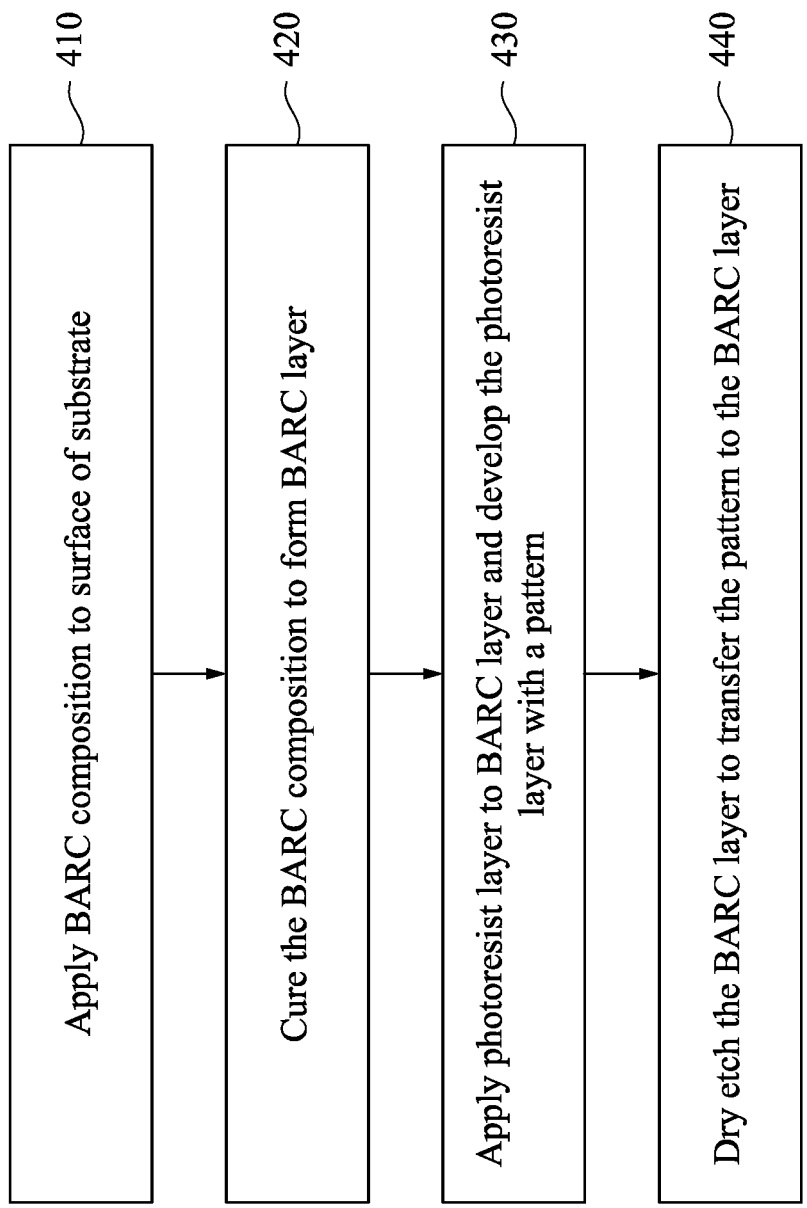
FIG. 4 is a flowchart illustrating a method for using the BARC, in accordance with some embodiments.

FIG. 4 is a flowchart illustrating a general method for using the BARC. In step 410, a bottom anti-reflective coating (BARC) composition of the present disclosure is applied upon a surface of a substrate. The BARC composition comprises a polymer formed from a styrene monomer as illustrated in any one of Formulas (I)-(VI). In step 420, the BARC composition is cured to form a BARC layer. In step 430, a photoresist layer is applied upon the BARC layer, exposed, and developed with a pattern. In step 440, the BARC layer is then dry etched to transfer the pattern to the BARC layer.

Figure 5A:
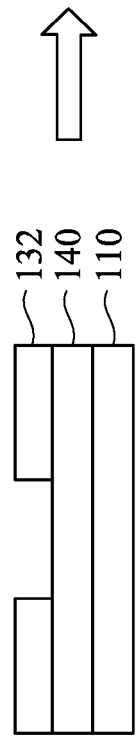
FIGS. 5A-5D illustrate one method for using the BARC, in accordance with some embodiments.
Figure 5B:
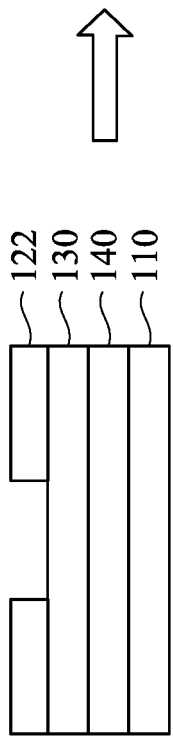
Figure 5C:
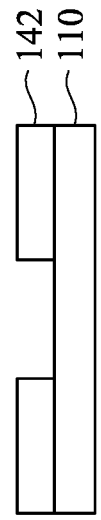
Figure 5D:
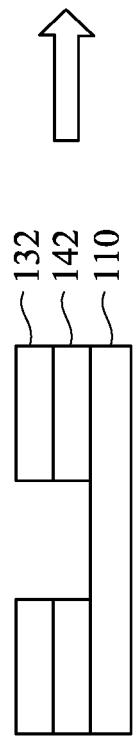

FIGS. 5A-5D illustrate one method for using the BARC, in accordance with some embodiments. As indicated in FIG. 5A, a metal layer 140 is applied to a silicon wafer substrate 110. A BARC layer 130 is then applied to the metal layer 140. A photoresist is then applied over the BARC layer, exposed, and developed with a given masking pattern to form a patterned photoresist layer 122. In FIG. 5B, the masking pattern is then transferred into the BARC layer 130 by dry etching, which typically removes materials using a plasma of various gases or gas mixtures (e.g., $O_2$, $Cl_2$, $CF_4$, $HCF_3$, $SF_6$, $N_2$, Ar, He, etc.) which are known in the art. After the BARC layer has been etched to obtain patterned BARC layer 132, the photoresist can be removed. In FIG. 5C, the exposed metal layer 140 can then be patterned using wet etching processes. Finally, in FIG. 5D, the BARC layer can then be removed by dry etching or by using different liquid stripping chemicals. The resulting substrate 110 has a patterned metal layer 142, and is ready for further processing.

Figure 6A:
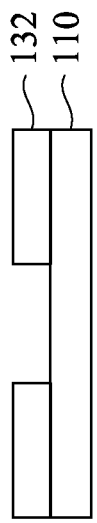
FIGS. 6A-6F illustrate two additional methods for using the BARC, in accordance with some embodiments.
Figure 6B:
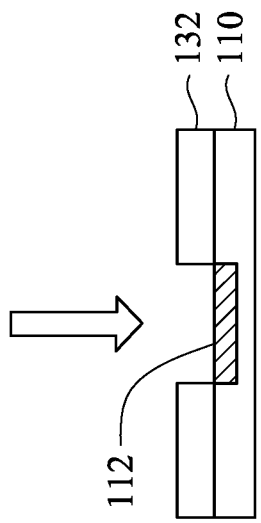

FIGS. 6A-6F illustrate other methods for using the BARC, in accordance with some embodiments, As indicated in FIG. 6A, a BARC layer 130 is made directly upon a silicon wafer substrate 110. A photoresist is then applied over the BARC layer, exposed, and developed with a given masking pattern to obtain patterned photoresist layer 122. In FIG. 6B, the masking pattern is then transferred into the BARC layer by dry etching to obtain patterned BARC layer 132. After the BARC layer has been etched, the photoresist can be removed.

Figure 6E:
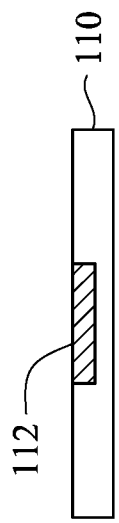
Figure 6F:
Figure 6C:
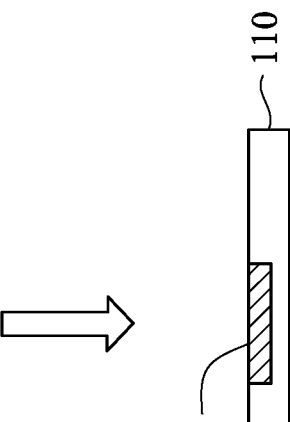
Figure 6D:
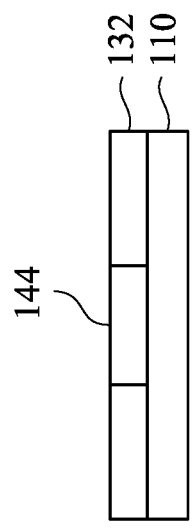

In one branch of the illustrated methods, following FIG. 6C, metal 144 is then applied to the exposed areas of the silicon wafer substrate. Finally, in FIG. 6D, the BARC layer (and any errant metal) is removed by dry etching or by using different liquid stripping chemicals. The resulting substrate 110 has a patterned metal layer 142, and is ready for further processing.

In another branch of the illustrated methods, in FIG. 6E, the silicon wafer substrate 110 can be selectively etched or implanted through the patterned BARC layer 132. As illustrated here, ions are implanted into the exposed areas of the silicon wafer substrate to form an implanted pattern 112, for example to change their conductivity and create source/drain electrodes. In FIG. 6F, the BARC layer is removed. The resulting substrate 110 includes an implanted pattern 112, and is ready for further processing.

The BARC compositions of the present disclosure, containing the polymers of Formula (I) or Formula (IV), and the BARCs formed therefrom have many advantages in use. They have a good combination of gap fill ability and wet etch resistance, compared to a polyhydroxystyrene (PHS) standard, at equal amounts of polymer. They have decreased metal boundary effect, or in other words they decrease the amount of lateral etching that occurs in underlying metal layers. They adhere well to metals.

Some embodiments of the present disclosure thus relate to a method for making a semiconductor device. A bottom anti-reflective coating composition is applied upon a surface of a substrate. The coating composition comprises a polymer formed from a styrene monomer having at least two hydrophilic substituents. The coating composition may alternatively comprise a polymer formed from a styrene monomer having only one hydrophilic substituent, with the proviso that the hydrophilic substituent is not hydroxyl. This may be done to reduce the reflectivity of the substrate, or to protect three-dimensional structures present on the surface of the substrate, or to protect a metal layer.

Other embodiments of the present disclosure relate to other methods of making a semiconductor device. A bottom anti-reflective coating (BARC) layer is applied upon a surface. The BARC layer comprises a polymer formed from (A) a styrene monomer having at least two hydrophilic substituents or (B) a styrene monomer having only one hydrophilic substituent which is not hydroxyl. A photoresist layer is applied upon the BARC layer. A masking pattern is formed in the photoresist layer. Then, the masking pattern is transferred to the BARC layer by etching.

Other embodiments of the present disclosure related to a wafer comprising a substrate and a bottom anti-reflective coating thereon. The bottom anti-reflective coating comprises a polymer formed from a styrene monomer having at least two hydrophilic substituents. The polymer may alternatively be formed from a styrene monomer having only one hydrophilic substituent, which is not hydroxyl.

Finally, other embodiments of the present disclosure relate to a bottom anti-reflective coating (BARC) composition. The composition comprises: a polymer formed from (A) a styrene monomer having at least two hydrophilic substituents or (B) a styrene monomer having only one hydrophilic substituent which is not hydroxyl; and a crosslinker. Such polymers are illustrated in Formulas (I)-(VI) above. The methods and compositions described above are useful for producing a semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a semiconductor device, comprising applying a bottom anti-reflective coating composition upon a surface of a substrate, wherein the coating composition comprises a polymer that includes a repeating unit of Formula (I) derived from a styrene monomer:

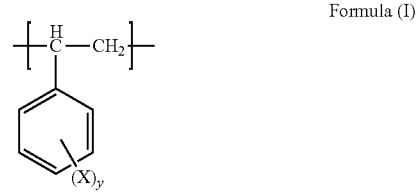

Formula (I)

wherein each X is a hydrophilic substituent independently selected from the group consisting of —NH$_2$, —NHR, —NR$_2$, —SH, —(C═O)H, —(C═O)R, —CO—NR$_2$, —NR—(C═O)R, —SO$_3$, —SO$_4$, and —PO$_4$, and salts and protected substituents thereof, wherein R is independently hydrogen, alkyl, alkenyl, alkynyl, or aryl; and where y is 2 to 5; and a crosslinker.

2. The method of claim 1, wherein a weight ratio of the polymer to the crosslinker is from about 10:90 to about 90:10, or from about 80:20 to about 60:40.

3. The method of claim 1, wherein the composition further comprises a solvent or a photo acid generator.

4. The method of claim 1, wherein the substrate is reflective; or wherein the surface includes three-dimensional structures, and the coating composition fills gaps between the three-dimensional structures; or wherein the substrate is metal.

5. The method of claim 1, wherein the polymer has a weight average molecular weight of about 1,000 to about 100,000.

6. The method of claim 1, wherein a backbone of the polymer contains only carbon-carbon bonds.

7. The method of claim 1, wherein when the styrene monomer has three or more hydrophilic substituents, the three or more substituents are not on continuous carbon atoms.

8. The method of claim 1, wherein the polymer is a copolymer formed from the styrene monomer and at least one co-monomer.

9. The method of claim 8, wherein the at least one co-monomer is a $C_2$-$C_8$ olefin, a substituted $C_2$-$C_8$ olefin, an acrylate, a diene, an acrylamide, acrylonitrile, acrylophenone, a different styrene monomer, or maleic acid.

10. The method of claim 9, wherein the styrene monomer is from about 10 mole % to about 90 mole % of the copolymer.

11. A method of making a semiconductor device, comprising
applying a bottom anti-reflective coating (BARC) layer upon a surface, wherein the BARC layer comprises a polymer that includes a repeating unit of Formula (I) derived from a styrene monomer:

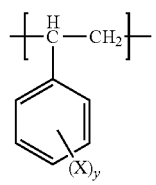

Formula (I)

wherein each X is a hydrophilic substituent independently selected from the group consisting of —$NH_2$, —NHR, —$NR_2$, —SH, —(C=O)H, —(C=O)R, —CO—$NR_2$, —NR—(C=O)R, —$SO_3$, —$SO_4$, and —$PO_4$, and salts and protected substituents thereof, wherein R is independently hydrogen, alkyl, alkenyl, alkynyl, or aryl; and wherein y is 2 to 5;
applying a photoresist layer upon the BARC layer;
forming a masking pattern in the photoresist layer; and
transferring the masking pattern to the BARC layer by etching.

12. The method of claim 11, wherein the BARC layer is applied to the surface of a metal layer, and further comprising:
removing the photoresist layer;
transferring the masking pattern to the metal layer by etching; and
removing the BARC layer.

13. The method of claim 11, wherein the BARC layer is applied to the surface of a wafer substrate, and further comprising:
removing the photoresist layer;
applying metal to the patterned BARC layer; and
removing the BARC layer.

14. The method of claim 11, wherein the BARC layer is applied to the surface of a wafer substrate, and further comprising:
removing the photoresist layer;
etching the wafer substrate or implanting ions through the patterned BARC layer; and
removing the BARC layer.

15. A bottom anti-reflective coating (BARC) composition, comprising:
a polymer that includes a repeating unit of Formula (I) derived from a styrene monomer:

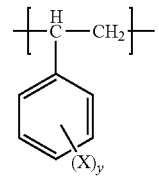

Formula (I)

wherein each X is a hydrophilic substituent independently selected from the group consisting of —$NH_2$, —NHR, —$NR_2$, —SH, —(C=O)H, —(C=O)R, —CO—$NR_2$, —NR—(C=O)R, —$SO_3$, —$SO_4$, and —$PO_4$, and salts and protected substituents thereof, wherein R is independently hydrogen, alkyl, alkenyl, alkynyl, or aryl; and
wherein y is 2 to 5; and
a crosslinker.

16. The composition of claim 15, further comprising a solvent, an acid generator, or a dye.

17. The composition of claim 15, wherein the polymer is a copolymer formed from the styrene monomer and at least one co-monomer.

18. The composition of claim 15, wherein the polymer has a weight average molecular weight of about 1,000 to about 100,000.

19. The composition of claim 15, wherein when the styrene monomer has three or more hydrophilic substituents, the three or more substituents are not on continuous carbon atoms.

20. The composition of claim 15, wherein a weight ratio of the polymer to the crosslinker is from about 10:90 to about 90:10, or from about 80:20 to about 60:40.

* * * * *